United States Patent [19]

Englert et al.

[11] Patent Number: 5,080,722
[45] Date of Patent: Jan. 14, 1992

[54] METHOD FOR CLEANING ELECTRICAL CONNECTORS

[75] Inventors: Paul J. Englert, Morristown, N.J.; Hugh Nicholl, Berthoud, Colo.; Peter H. Read, Falls Township, Bucks County, Pa.

[73] Assignee: AT&T Bell Laboratories, Murray Hill, N.J.

[21] Appl. No.: 661,363

[22] Filed: Feb. 26, 1991

[51] Int. Cl.⁵ .............. B08B 3/04; B08B 3/10
[52] U.S. Cl. ..................... 134/26; 134/25.1; 134/25.4; 134/37; 252/170
[58] Field of Search .......... 134/26, 25.1, 25.4, 134/37; 252/170

[56] References Cited

U.S. PATENT DOCUMENTS

| 4,635,666 | 1/1987 | Daley et al. | 134/902 |
| 4,666,626 | 5/1987 | Francisco | 252/170 |
| 4,867,800 | 9/1989 | Dishart et al. | 252/170 |

OTHER PUBLICATIONS

"Performance Products for Industrial Cleaning", Exxon Chemical Company.

Primary Examiner—Theodore Morris
Assistant Examiner—Zeinab El-Arini
Attorney, Agent, or Firm—L. H. Birnbaum

[57] ABSTRACT

Disclosed is a method for cleaning solder flux connectors. A first solution comprising a monobasic ester is applied to the connectors. A second solution, which can include a solvent for a lubricant, is then applied to displace the first solvent.

8 Claims, 2 Drawing Sheets

METHOD FOR CLEANING ELECTRICAL CONNECTORS

BACKGROUND OF THE INVENTION

This invention relates to fabricating electrical connectors and circuit packs including electrical connectors.

In the fabrication of a typical circuit pack, a socket-type connector is attached to the edge of a printed circuit board, and electrical contact is made to the board by soldering connector tail portions to conductive pads on the board. One of the problems in assembling circuit packs is that the flux used in the soldering operation, which is usually rosin-based, can be left behind on the connector's contacts and interfere with electrical conduction when the flux hardens. Present techniques for removing the flux typically involve the application of chlorofluorocarbon (CFC) solvents which are now known to be harmful to the environment.

A further requirement in circuit pack assembly is to minimize the insertion force when mating the connector with compliant backplane pins. In order to accomplish this, it is desirable to apply to the connector a lubricant dissolved in a solvent which will, after evaporation, leave a thin, even layer of lubricant on the contacts. Typical present techniques include the use of CFC solvents to carry the lubricant.

It is, therefore, an object of the invention to clean connectors in a manner which is not harmful to the environment. It is a further object to lubricate the connectors in a manner which is not harmful to the environment.

SUMMARY OF THE INVENTION

These and other objects are achieved in accordance with the invention which is a method of cleaning solder flux from an electrical connector. A first solution comprising monobasic ester is applied to the connector. A second solution comprising an isoparaffinic hydrocarbon is then applied to the connector to displace the first solution from the connector.

BRIEF DESCRIPTION OF THE DRAWING

These and other features of the invention are delineated in detail in the following description. In the drawing.

It will be appreciated that, for purposes of illustration, these figures are not necessarily drawn to scale.

DETAILED DESCRIPTION

Figure 1:
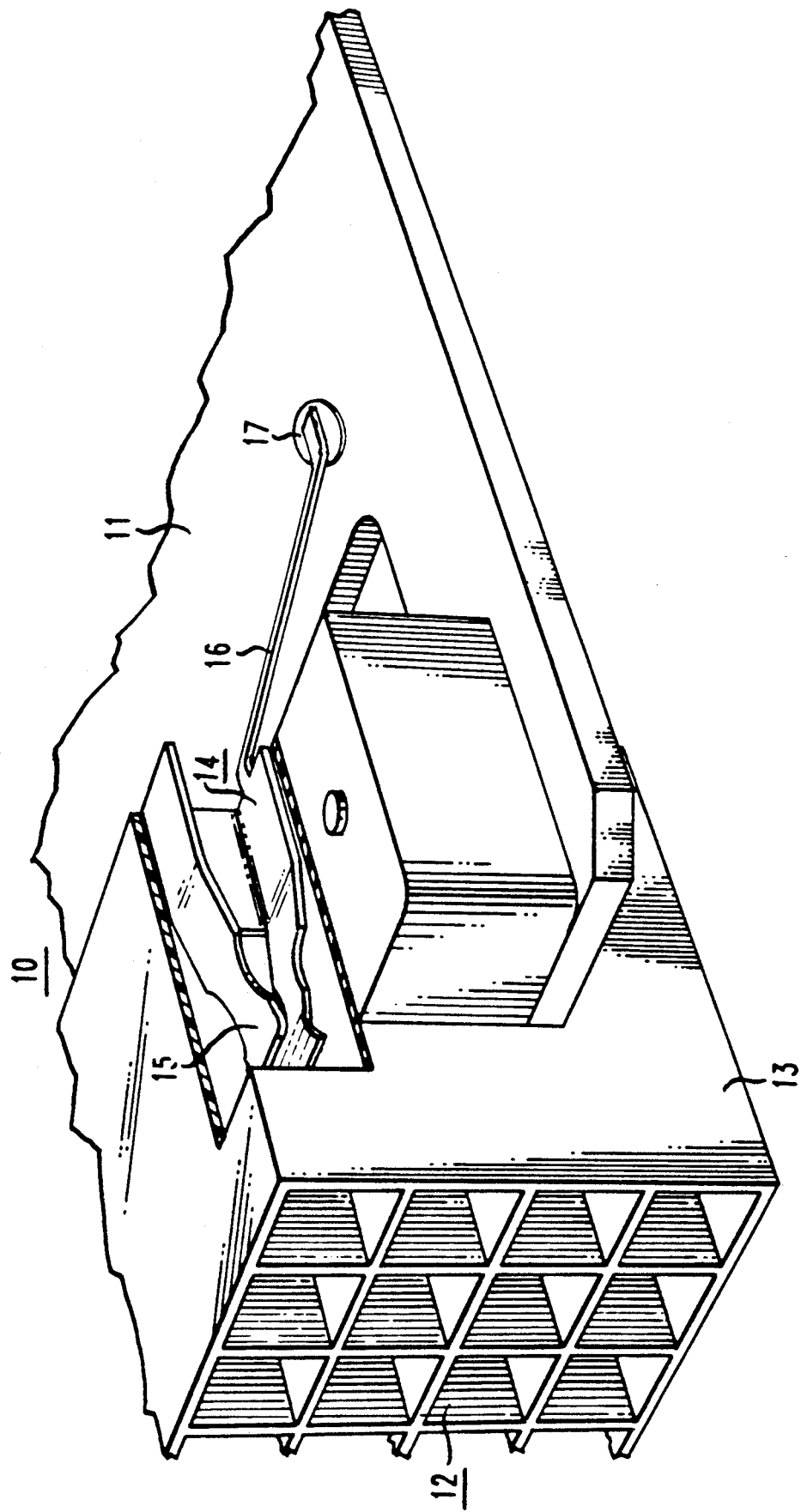
FIG. 1 is a perspective, partly cut-away, view of a circuit pack which can make use of the invention.

FIG. 1 illustrates a typical circuit pack, 10, which can be cleaned and lubricated in accordance with the invention. The circuit pack includes a printed circuit board, 11, to which electronic components (not shown) will eventually be bonded. A socket-type electrical connector, 12, is mounted to one edge of the circuit board. The connector includes an insulating housing, 13, which is divided into a plurality of portions for receiving individual compliant pins (not shown). Each portion includes a contact 14 with a tyne, 15, for engaging the compliant pin, and a tail portion 16 which extends out of the back of the connector housing. Each tail portion is soldered to a corresponding conductive pad, e.g., 17, on the printed circuit board in order to make electrical contact to the components to be mounted on the board.

The tail portions are typically soldered by means of standard techniques including the use of a rosin-based flux in order to prevent oxidation of the conductive surfaces. Unfortunately, once the flux hardens it tends to act as an insulator. Consequently, any flux remaining in the connector housing 13 after soldering should be removed to prevent degradation of the electrical contact between the pins and socket connector.

Figure 2:
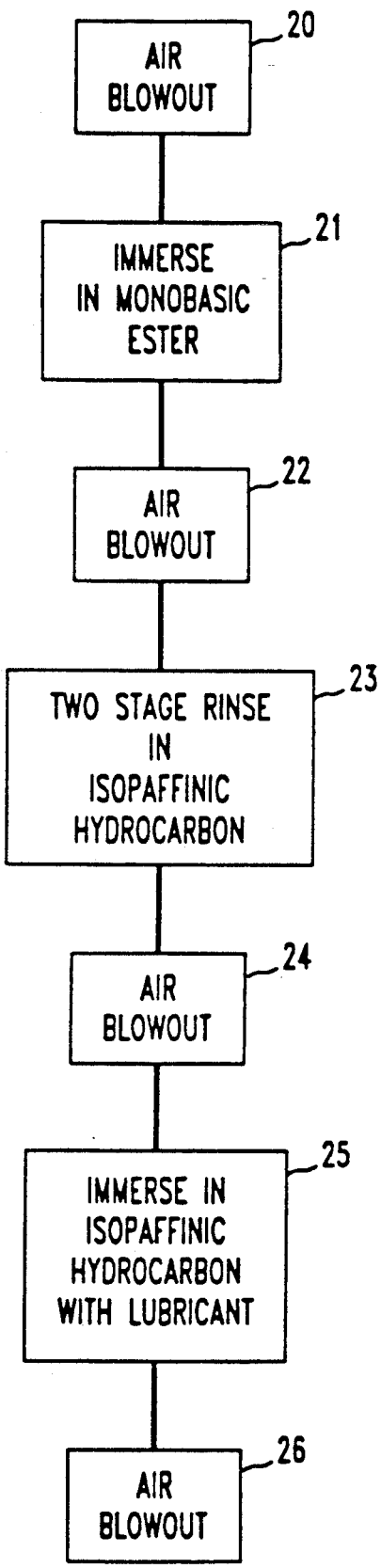
FIG. 2 is a block diagram of the method in accordance with an embodiment of the invention.

Circuit packs such as shown in FIG. 1, therefore, were subjected to the method illustrated in the block diagram of FIG. 2. In the first step, illustrated by block 20, the circuit packs were subjected to an air blowout whereby compressed air was directed to the connector, 12, specifically through the backside of the connector, in order to blow out any dust or other contaminants from the connector housing. Standard air knives can be used for this purpose, and the pads were subjected to this blowout for approximately 40 seconds.

The next step, illustrated in block 21, involves the removal of the residual flux from the connector housing. This is accomplished by immersion of the circuit packs in a bath comprising a monobasic ester such as that sold by Exxon under the registered trademark EXXATE. In particular, the EXXATE material comprises an alkyl acetate such as hexyl or decyl acetate.

Immersion was typically for a period of 30–60 seconds with the solvent at room temperature. To enhance the flushing out of flux from the connector housing, the bath was agitated by either gas sparging or fountain spraying. In the gas sparging method, compressed air was transmitted through a tube with holes at the bottom of the tank so that the escaping air produced bubbles in the bath. In the fountain spraying method, the solvent was recirculated by means of a pump through a fountain head situated above the level of the liquid.

The monobasic ester was found to be an effective solvent for the flux, and possessed a low toxicity, a high flash point (57° C.) and no ozone depletion potential.

After emerging from the bath, the circuit packs were subjected to a second air blowout, illustrated by block 22, in order to remove the bulk of the monobasic ester from the connector. Again, high pressure, room temperature air was utilized with standard air knives directed through the backside of the connector cavities for approximately 40 seconds.

The blowout leaves some of the cleaning solvent behind in the connector housing, typically a few tenths of a cubic centimeter. Since the solvent has a noticeable odor, it is desirable to remove as much of it as possible. In order to remove this residual material, a rinsing operation was performed as illustrated by block 23. The objective in this step is to displace the remaining ester with another, lower flash point, less odorous solvent which could then be removed more readily by a subsequent air blowout.

The circuit packs were immersed in a first bath comprising a synthetic, high purity, isoparaffinic hydrocarbon which, in this example, was a material sold by Exxon under the registered trademark ISOPAR. In particular, the bath comprises $C_{11}$–$C_{12}$ isoparaffinic hydrocarbon.

Again, the bath was at room temperature and was agitated by gaseous sparging or fountain spraying. The packs were immersed for a period of approximately 30 seconds. Upon emerging from the first bath, the circuit packs were immersed in a second bath containing the same solvent (ISOPAR), which was also agitated and held at room temperature. Immersion in the second bath was also for a period of approximately 30 seconds.

As a result of the two stage rinse, the more volatile and less odorous isoparaffinic hydrocarbon flushed out and dissolved the remaining monobasic ester in the connector. The subsequent air blowout, as illustrated by block 24, then served to remove the remaining isoparaffin.

Immediately subsequent to the cleaning operation, it is desirable to lubricate the connector contacts to reduce insertion forces. For this purpose, the circuit packs were immersed in another bath as illustrated by block 25. This bath included approximately 1% by weight of a lubricant dissolved in the same type of isoparaffinic hydrocarbon used previously in the rinse operation. In this example, the lubricant was a polyphenyl ether, in particular, that sold by Monsanto under the designation OS-138. Again, the bath was held at room temperature, and was agitated by gaseous sparging or fountain spraying. The circuit packs were immersed for a period of approximately 30 seconds.

A final air blowout, as illustrated by block 26, was performed to remove the lubricant solvent from the connector housing. Preferably this blowout includes two stages. The first stage utilizes the same type of high pressure, room temperature air technique for approximately 40 seconds applied previously, this time to remove the bulk of the solvent and to evenly distribute lubricant over the contacts. In the next stage, the air is applied to the connector by a bank of air knives where the flow velocity is relatively low (approximately an order of magnitude less than the velocity in previous steps). This second stage causes the evaporation of any small amount of isoparaffinic hydrocarbon remaining inside the connector. Each circuit pack in this example was subjected to this evaporation stage for a period of approximately 2 minutes.

It will be appreciated that although the rinse in isoparaffinic hydrocarbon (block 23) and immersion in a lubricant (block 25) are shown as separate steps, it should be possible to combine the two by immersing the circuit packs into a solution including isoparaffinic hydrocarbon and lubricant immediately after the air blowout (block 22) following the cleaning step (block 21). The hydrocarbon should still displace the ester while the lubricant coats the contacts. It will also be appreciated that, although the invention has been described in terms of cleaning socket-type connectors, the method can be performed on other types of electrical connectors such as the gold finger portions of circuit cards designed for insertion in edge card connectors. Finally, although blowouts were described as using air, other gases may be employed.

Various additional modifications will become apparent to those skilled in the art. All such variations which basically rely on the teachings through which the invention has advanced the art are properly considered within the scope of the invention.

We claim:

1. A method of cleaning solder flux from an electrical connector comprising the steps of:
   applying a first solution comprising a monobasic ester to the connector;
   applying a second solution to the connector to displace the first solution from the connector; and
   applying a third solution to the connector subsequent to applying the second solution, the said third solution comprising a lubricant.

2. The method according to claim 1 wherein the second solution comprises an isoparaffinic hydrocarbon.

3. The method according to claim 1 wherein a gas is blown on the connector between the application of the two solutions.

4. The method according to claim 1 wherein the third solution also comprises an isoparaffinic hydrocarbon as a solvent for the lubricant.

5. The method according to claim 1 further comprising, subsequent to applying the third solution, applying a gas to the connector at a relatively high velocity followed by applying air at a relatively low velocity.

6. The method according to claim 1 wherein the connector is a socket-type connector mounted on the edge of a printed circuit board.

7. The method according to claim 1 wherein the solutions are agitated.

8. The method according to claim 1 wherein the first solution comprises an alkyl acetate, the second solution comprises $C_{11}$-$C_{12}$ isoparaffinic hydrocarbon and the third solution comprises a polyphenyl ether dissolved in a solvent consisting essentially of $C_{11}$-$C_{12}$ isoparaffinic hydrocarbon.

* * * * *